United States Patent [19]

Peterson

[11] Patent Number: 6,072,815
[45] Date of Patent: Jun. 6, 2000

[54] MICROLASER SUBMOUNT ASSEMBLY AND ASSOCIATES PACKAGING METHOD

[75] Inventor: Brian Lee Peterson, Charlotte, N.C.

[73] Assignee: Litton Systems, Inc., Charlotte, N.C.

[21] Appl. No.: 09/032,457

[22] Filed: Feb. 27, 1998

[51] Int. Cl.[7] .................................................. H01S 3/04
[52] U.S. Cl. ............................... 372/36; 372/34; 372/43; 372/50
[58] Field of Search ................................ 372/34, 36, 50, 372/74, 43, 81

[56] References Cited

U.S. PATENT DOCUMENTS

| | | | |
|---|---|---|---|
| 4,012,833 | 3/1977 | Akiyama | 29/591 |
| 4,338,577 | 7/1982 | Sato et al. | 372/36 |
| 4,411,057 | 10/1983 | Duda et al. | 372/36 X |
| 4,546,478 | 10/1985 | Shimizu et al. | 372/36 |
| 4,550,333 | 10/1985 | Ridder et al. | 372/36 X |
| 4,603,419 | 7/1986 | Shimizu et al. | 372/36 |
| 4,731,795 | 3/1988 | Clark et al. | 372/107 |
| 4,768,199 | 8/1988 | Heinen et al. | 372/36 |
| 4,860,304 | 8/1989 | Mooradian | 372/92 |
| 4,897,711 | 1/1990 | Blonder et al. | 372/36 X |
| 4,902,654 | 2/1990 | Aubert et al. | 501/117 |
| 4,904,036 | 2/1990 | Blonder | 372/50 X |
| 4,953,166 | 8/1990 | Mooradian | 372/21 |
| 4,962,504 | 10/1990 | Aubert et al. | 372/41 |
| 5,029,335 | 7/1991 | Fisher et al. | 372/36 |
| 5,113,404 | 5/1992 | Gaebe et al. | 372/36 |
| 5,115,445 | 5/1992 | Mooradian | 372/75 |
| 5,124,281 | 6/1992 | Ackerman et al. | 372/74 X |
| 5,156,999 | 10/1992 | Lee | 437/215 |
| 5,181,214 | 1/1993 | Berger et al. | 372/34 |
| 5,233,580 | 8/1993 | Tanaka et al. | 372/36 X |
| 5,256,164 | 10/1993 | Mooradian | 372/99 |
| 5,264,392 | 11/1993 | Gaebe et al. | 437/209 |
| 5,265,113 | 11/1993 | Halldörsson et al. | 372/36 |
| 5,265,116 | 11/1993 | Mooradian | 372/75 |
| 5,295,146 | 3/1994 | Gavrilovic et al. | 372/41 |
| 5,319,653 | 6/1994 | Favennec et al. | 372/7 |
| 5,357,536 | 10/1994 | Andrews | 372/50 |
| 5,365,539 | 11/1994 | Mooradian | 372/75 |
| 5,394,413 | 2/1995 | Zayhowski | 372/10 |
| 5,402,437 | 3/1995 | Mooradian | 372/92 |
| 5,404,368 | 4/1995 | Makita et al. | 372/36 |
| 5,490,158 | 2/1996 | Mogi | 372/36 |
| 5,495,494 | 2/1996 | Molva et al. | 372/98 |
| 5,502,737 | 3/1996 | Chartier et al. | 372/11 |
| 5,574,740 | 11/1996 | Hargis et al. | 372/41 |
| 5,703,890 | 12/1997 | Thony et al. | 372/12 |
| 5,828,683 | 10/1998 | Freitas | 372/36 |

FOREIGN PATENT DOCUMENTS

| | | |
|---|---|---|
| 0742613A1 | 11/1996 | European Pat. Off. ............. 372/50 X |
| 0742615A1 | 11/1996 | European Pat. Off. ............. 372/50 X |
| 0742616A1 | 11/1996 | European Pat. Off. ............. 372/50 X |

OTHER PUBLICATIONS

Brochure for sfim ODS, *Microchip Lasers—All–in–one Lasers—An Original Concept—For Innovative Solutions*. (No Date of Publication).

*Primary Examiner*—Brian Healy
*Attorney, Agent, or Firm*—Alston & Bird LLP

[57] ABSTRACT

The submount assembly includes a heat sink and a submount mounted upon the heat sink that is formed of a thermally conductive, electrically insulating material so as to transfer heat from the various components mounted upon the submount to the heat sink while effectively electrically isolating the various components mounted upon the submount. The first surface of the submount defines at least one registration feature, such as at least one recess, for precisely aligning components mounted thereupon. For example, the submount assembly can include a microresonator cavity including an active gain medium disposed within a respective recess defined by the submount. The submount assembly can also include a laser diode mounted upon the submount in alignment with the active gain medium such that the output of the laser diode pumps the active gain medium. The submount assembly also generally includes first and second metallization layers disposed upon different portions of the submount to thereby form a cathode and an anode, respectively. The present invention also provides a method for packaging the submount assembly which reduces the risk of damage to the components mounted upon the submount.

21 Claims, 8 Drawing Sheets

MICROLASER SUBMOUNT ASSEMBLY AND ASSOCIATES PACKAGING METHOD

FIELD OF THE INVENTION

The present invention relates generally to a submount assembly and associated packaging methods and, more particularly, to a microlaser submount assembly and associated methods for packaging the microlaser.

BACKGROUND OF THE INVENTION

Modern electro-optic systems are being further miniaturized such that many electro-optic components are commonly mounted upon the same platform. The platform typically includes a submount which may be mounted upon a heat sink, such as a heat pump or the like. As such, the submount is generally formed of a thermally conductive material, such as a metal or semiconductor, in order to provide a path of relatively low thermal impedance from the various electro-optic components mounted upon the submount to the underlying heat sink.

In order to properly function, the various components of the electro-optic system must be precisely aligned. For example, an electro-optic system that includes a pump diode and an associated laser crystal or active gain medium requires that the pump diode be precisely aligned with the laser crystal as well as various other optical components, such as lenses, mirrors and the like. While this alignment has always been somewhat challenging, the alignment of the various components of an electro-optic system has become increasingly critical and increasingly difficult as the various components of the electro-optic systems have become even smaller.

Once the various electro-optic elements have been appropriately mounted upon the submount, the submount assembly, including the submount and any underlying heat sink, is commonly mounted in an appropriate package, such as a TO-3 or TO-8 package. As is known to those skilled in the art, electro-optic packages, such as a TO-3 or TO-8 package, includes a number of conductive pins which must be electrically connected to appropriate leads of the submount assembly in order to provide the necessary electrical energy to the electro-optic system. Even if the various electro-optic components are properly mounted upon the submount, the mounting of the submount assembly within the package and the establishment of the electrical connections between the conductive pins of the package and respective leads of the submount assembly can disadvantageously affect the performance of the electro-optic system. In particular, the mounting of the submount assembly within a package generally requires handling of the submount assembly which may expose the submount assembly and, more particularly, the various electro-optic components, to static electricity and other deleterious conditions. In addition, conventional packaging techniques, including the establishment of appropriate electrical connections between the conductive pins of a package and the respective leads of the submount assembly, may disadvantageously heat the various electro-optic components.

Although a variety of miniaturized electro-optic systems have been developed which include submounts and associated heat sinks for providing heat dissipation for the various electro-optic components, a need still exists for improved techniques for aligning the various electro-optic components of a miniaturized electro-optic system. Moreover, a need still exists for improved packaging techniques in order to appropriately package an electro-optic system without adversely affecting the electro-optic components.

SUMMARY OF THE INVENTION

It is therefore an object of the present invention to provide an improved submount assembly which includes a submount for aligning respective components of an electro-optic system.

It is another object of the present invention to provide an improved submount assembly having a submount which is not only thermally conductive, but is also electrically insulating to therefore electrically isolate the various electro-optic components mounted upon the submount.

It is a further object of the present invention to provide an improved method of packaging an electro-optic system in which at least some of the electro-optic components are mounted upon the submount following the placement of the submount assembly within the package and the establishment of appropriate electrical connections between the conductive pins of the package and respective leads of the submount assembly in order to reduce handling of the submount assembly subsequent to the mounting of the various electro-optic components upon the submount.

These and other objects are provided, according to one advantageous embodiment of the present invention, by a submount assembly that includes a heat sink and a submount mounted upon the heat sink that is formed of a thermally conductive, electrically insulating material, such as beryllium oxide, aluminum oxide or aluminum nitride, so as to transfer heat from the various components mounted upon the submount to the heat sink while effectively electrically isolating the various components mounted upon the submount. The first surface of the submount preferably defines at least one registration feature for aligning respective components. As such, the submount assembly of the present invention provides precise alignment for the various electro-optic components mounted upon the submount.

According to one advantageous embodiment, the submount defines at least one and, more commonly, a plurality of recesses for receiving respective components. For example, the submount assembly can include an active gain medium disposed within a respective recess and a laser diode mounted upon the first surface of the submount in alignment with the active gain medium such that the output of the laser diode pumps the active gain medium. The submount assembly also preferably includes first and second metallization layers disposed upon different portions of the submount to thereby form a cathode and an anode, respectively. Advantageously, the first and second metallization layers can be disposed within respective recesses defined by the first surface of the submount. Since the submount is not only thermally conductive but is also electrically insulating, the submount effectively electrically isolates the various components including the active gain medium, the laser diode and the first and second metallization layers.

According to another advantageous embodiment in which the first surface of the submount includes an upper shelf and a lower shelf, the registration feature preferably includes an upstanding wall extending between the upper and lower shelves. The submount assembly of this advantageous embodiment can also include an active gain medium disposed upon the lower shelf adjacent the upstanding wall and a laser diode mounted upon the upper shelf in alignment with the active gain medium such that the output of the laser diode pumps the active gain medium. Regardless of the embodiment, the submount assembly of the present invention therefore effectively aligns the various components of an electro-optic system.

According to one particularly advantageous embodiment, the submount assembly includes a submount having a first surface which defines a first groove. The submount assembly of this embodiment also includes a laser diode mounted upon a sidewall of the first groove such that the output of the laser diode is directed toward the opening of the first groove through the first surface of the submount. The submount assembly of this embodiment also includes an active gain medium supported by the first surface of the submount so as to overlie at least that portion of the first groove within which the laser diode is disposed. As such, the output of the laser diode pumps the active gain medium.

The submount assembly of this embodiment can also include a second groove opening through the first surface of the submount and extending between one edge of the submount and the first groove such that the laser diode is exposed by the second groove. The second groove therefore permits the laser diode to be precisely mounted upon the sidewall of the first groove. In this regard, the submount assembly can include a thermal spreader upon which the laser diode is mounted. The thermal spreader is preferably sized relative to the depth of the first groove such that by positioning the thermal spreader so as to contact a bottom surface of the first groove, the laser diode carried by the thermal spreader will be properly spaced from the overlying active gain medium.

The first surface of the submount also preferably defines a plurality of ledges opening into the first groove. The plurality of ledges serve to support edge portions of the active gain medium such that the active gain medium bridges the first groove and overlies the laser diode.

The present invention also provides an advantageous method for packaging an electro-optic system. According to this aspect of the present invention, at least one registration feature, such as at least one recess, is defined on a first surface of a submount. The submount assembly including the submount is then mounted upon a support surface of a package. Electrical connections are then established between the conductive pins of the package and respective leads of the submount assembly. Once the submount assembly has been mounted within the package and appropriate electrical connections have been established, various electro-optic components are mounted upon the submount in alignment with the registration feature defined by the first surface of the submount. As such, the packaging method of this aspect of the present invention reduces handling and heating of the submount assembly and, more particularly, the electro-optic components that are mounted upon the submount. As such, the packaging method of the present invention reduces the exposure of the electro-optic components to heat, static electricity and other deleterious conditions.

Therefore, the submount assembly of the present invention includes a submount for precisely aligning the various components of an electro-optic system, including a laser diode and an associated active gain medium. In addition, the submount assembly of the present invention includes a submount which is not only thermally conductive, but is also electrically insulating in order to effectively electrically isolate the various electro-optic components mounted upon the submount. Further, the packaging method of the present invention reduces handling and heating of the submount assembly following the mounting of the electro-optic components upon the submount, thereby reducing exposure of the various components to heat, static electricity and other deleterious conditions.

BRIEF DESCRIPTION OF THE DRAWINGS

FIGS. 10A–10C are a series of sequential views illustrating the method of packaging an electro-optic system according to one aspect of the present invention in which

DETAILED DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
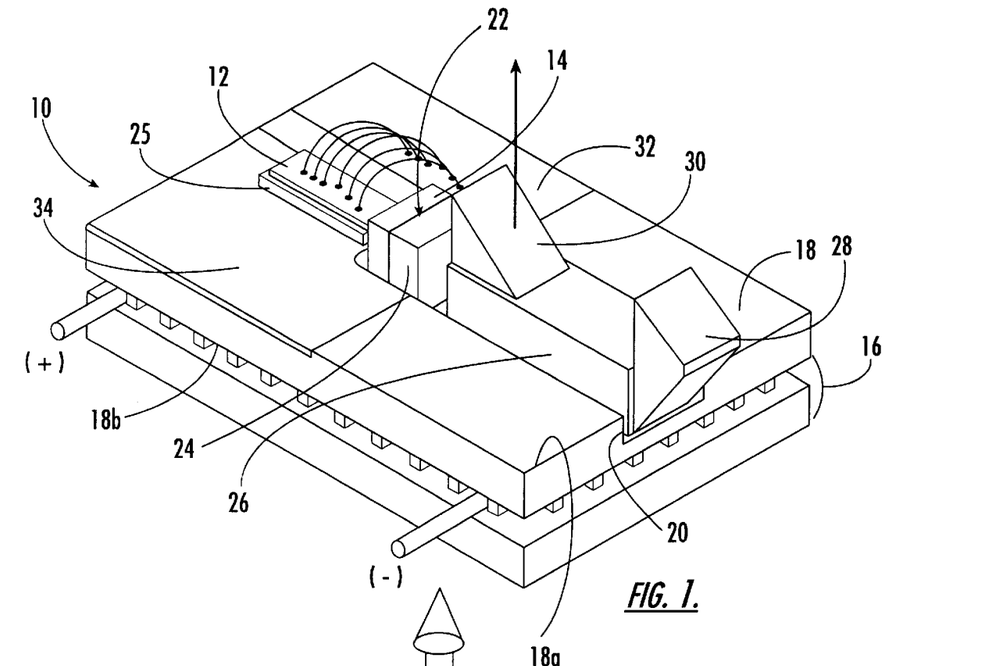
FIG. 1 is a perspective view of a submount assembly according to one embodiment of the present invention.

Referring now to FIG. 1, the submount assembly 10 according to one embodiment of the present invention is illustrated. Although the submount assembly can support any of a variety of electro-optic systems, the submount assembly is particularly advantageous for supporting and aligning a microlaser system which requires precise alignment between a laser diode 12 and a laser crystal or other active gain medium 14. As such, the submount assembly will be hereinafter described in conjunction with a microlaser system.

As illustrated, the submount assembly 10 includes a heat sink 16 and a submount 18 mounted upon the heat sink. It will be understood by those having skill in the art that an element or component that is described as being "on" or "mounted upon" another element may be either mounted directly on the underlying element or may merely overlie the other element with one or more intervening layers or elements being disposed between the elements. Although the heat sink can be a passive heat sink formed of thermally conductive material, such as a silver base plated with an alloy of gold and nickel, the heat sink can also be an active heat sink or heat pump such as a Peltier heat pump or other thermoelectric cooler. As used herein, the term "heat sink" therefore includes not only heat sinks which cool a component by accepting waste heat, but also heat pumps which generate additional heat in order to warm a component.

The submount 18 is formed of a thermally conductive material for providing impedance low thermal impedance to the heat sink 16. According to the present invention, the material which forms the submount is also electrically insulating so as to electrically isolate the various electro-optic components mounted upon the submount. For example, the submount effectively electrically isolates the laser diode 12 and the active gain medium 14 as described below. Although the submount can be formed of a variety of thermally conductive, electrically insulating materials, the submount of one advantageous embodiment is formed of beryllium oxide, aluminum oxide or aluminum nitride which are both thermally conductive and electrically insulating.

The submount 18 has opposed first and second surfaces 18a,18b. According to the present invention, the first surface of the submount defines at least one registration feature 20 for aligning the various electro-optic components supported by the submount. Although the first surface of the submount can define a variety of registration features as described hereinbelow, the submount of one advantageous embodiment defines at least one and, more particularly, a plurality of recesses or slots for receiving respective components of the electro-optic system supported by the submount.

In the embodiment illustrated in FIG. 1, the first surface 18a of the submount 18 definers a slot-like recess 20 having a relatively flat bottom and opposed upwardly extending sidewalls for receiving one or more electro-optic components. In the illustrated embodiment, the submount assembly also includes a microresonator cavity 22 disposed within and adjacent one end of the slot.

The microresonator cavity 22 preferably includes an active gain medium 14 and a saturable absorber 24 sandwiched between a pair of mirrors that define the resonant cavity. In this regard, one example of a suitable microresonator cavity is described by U.S. Pat. No. 5,394,413 to John J. Zayhowski which issued on Feb. 28, 1995, the contents of which are incorporated in their entirety herein. According to one advantageous embodiment, the microresonator cavity includes an active gain medium formed of neodymium-doped yttrium aluminum garnet (YAG) and the saturable absorber formed of tetravalent chrome-doped YAG. Although the active gain medium of one advantageous embodiment is doped with approximately 1.6 atomic percent of neodymium, the active gain medium and the saturable absorber can include different dopant percentages without departing from the spirit and scope of the present invention. The microresonator cavity of this embodiment will emit laser pulses having a wavelength of 1.06 microns. As will be apparent to those skilled in the art, however, the active gain medium 14 and the saturable absorber 24 can be constructed of different materials in order to provide laser outputs having different properties, such as different wavelengths.

The submount assembly 10 of the embodiment illustrated in FIG. 1 also includes a laser diode 12 mounted upon the first surface 18a of the submount 18 in alignment with the microresonator cavity 22 and, more particularly, the active gain medium 14 of the microresonator cavity. As such, the output of the laser diode pumps the active gain medium such that the microresonator cavity emits a series of laser pulses. As described below, the laser diode is preferably spaced somewhat, such as 20±5 microns, from the microresonator cavity. In addition, although the submount assembly of this embodiment can include a variety of laser diodes, the laser diode of one advantageous embodiment is formed of gallium arsenide and provides 1.2 watts of pump power.

As shown in FIG. 1, the laser diode 12 can be mounted upon a thermal spreader 25 formed of a thermally conductive material which, in turn, is mounted upon the first surface 18a of the submount 18. For example, the thermal spreader may be formed of gold metallized diamond. In this regard, the diamond is typically a synthetic diamond that has been grown by a chemical vapor deposition process. Once grown, the diamond is generally polished and a gold coating is evaporatively deposited upon the diamond. The thermal spreader also generally has a larger footprint than the laser diode so as to effectively spread the heat generated by the laser diode over a broader area of the submount.

Although not necessary for the practice of the present invention, the submount assembly 10 can also include a variety of other electro-optic components downstream of the microresonator cavity 22 for appropriately processing the laser pulses emitted by the microresonator cavity. In the embodiment illustrated in FIG. 1, for example, the submount assembly also includes a frequency doubling crystal 26, typically formed of $KTiOPO_4$, i.e., KTP. In addition, the submount assembly of FIG. 1 can include an anti-reflection coated fold prism 28 and a silver-coated right angle prism 30 for folding the output of the microresonator cavity and for thereafter directing the output of the microresonator cavity in a direction generally perpendicular to the submount 18. For a submount disposed in a horizontal position, the output of the electro-optic system can therefore be directed vertically as shown in FIG. 1. More particularly, for a submount assembly which includes a microresonator cavity having an active gain medium 16 formed of neodymium-doped YAG and a saturable absorber 24 formed of tetravalent chrome-doped YAG which emits laser pulses having a wavelength of 1.06 micron, the submount assembly illustrated in FIG. 1 will produce linearly polarized pulses having a wavelength of 532 nanometers.

The submount assembly 10 also includes first and second metallization layers 32,34 disposed upon different portions of the submount 18 to thereby form a cathode and an anode, respectively. Although the metallization layers can be formed of a variety of electrically conductive materials, the first and second metallization layers of one advantageous embodiment are formed of diffusion bonded copper. As also shown in FIG. 1, the first and second metallization layers can be disposed within respective recesses 20 defined by the first surface 18a of the submount.

Once the laser diode 12 has been mounted upon the submount 18, appropriate electrical connections can be established between the cathode, the anode and the laser diode as will be described in more detail hereinafter in conjunction with the fabrication method of the present invention. In this regard, the laser diode and, more particularly, the thermal spreader 25 upon which the laser diode is mounted can be mounted upon one of the metallization layers 32,34. Since the thermal spreader is metallized, the mounting of the thermal spreader upon the metallization layer establishes a electrical connection between the underlying metallization layer and the laser diode. One or more wire bonds or ball bonds can also be formed between an upper surface of the laser diode and the other metallization layer, as illustrated in FIG. 1. By applying appropriate voltage and current to the anode and cathode, the electro-optic system carried by the submount assembly 10 will provide the desired laser output.

Figure 2:
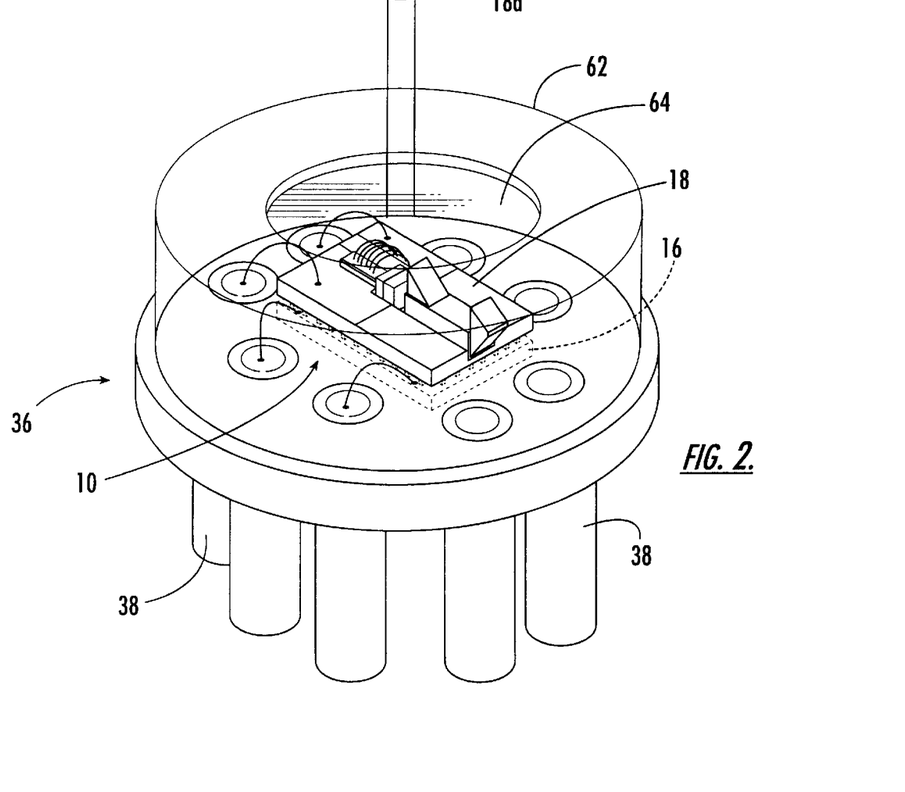
FIG. 2 is a perspective view of the submount assembly in FIG. 1 mounted within an electro-optic package.

As shown in FIG. 2, for example, the submount assembly 10 is generally mounted within an electro-optic package 36, such as TO-8 package or a TO-3 package, as will be described in more detail hereinafter. As shown in FIG. 2, however, the package generally includes a plurality of conductive pins 38 surrounding the submount assembly. By establishing appropriate electrical connections between the conductive pins of the package and the respective leads of the submount assembly, including the anode, the cathode and any electrical leads associated with the heat sink 16, the electro-optic system can be operated by appropriate driving the conductive pins of the electro-optic package.

Figure 3:
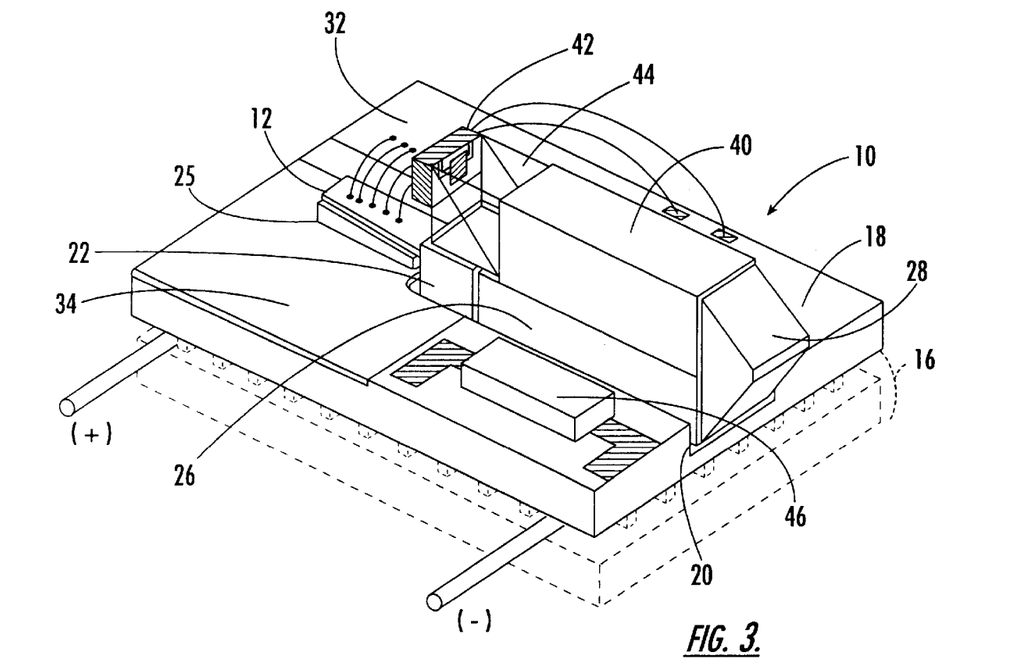
FIG. 3 is a perspective view of the submount assembly according to another embodiment of the present invention.

As shown in FIGS. 3–8, the submount 18 can support a variety of electro-optic systems. With reference to FIG. 3, for example, the electro-optic system can include a fourth harmonic generator 40, typically formed of BBO, disposed downstream of the frequency doubling crystal 26 in order to generate a fourth order output. Accordingly, for a submount assembly 10 which includes a microresonator cavity 22 having an active gain medium 16 formed of neodymium-doped YAG and a saturable absorber 24 formed of tetravalent chrome-doped YAG which emits laser pulses having a wavelength of 1.06 micron, the submount assembly illustrated in FIG. 3 will produce linearly polarized pulses having a wavelength of 266 nanometers.

In addition, the electro-optic system can include an energy monitor 42 downstream of the fourth harmonic generator 40 in order to measure the energy of the laser output. As such, the electro-optic system also includes a beam splitter 44, positioned downstream of the fourth harmonic generator, for providing the energy monitor with a fraction of the laser output while directing the remainder of the laser output in a direction generally perpendicular to the submount 18. As also shown in FIG. 3, the submount assembly 10 can also include the temperature sensor 46 mounted upon the first surface 18a of the submount for monitoring the temperature of the submount. The temperature sensor is electrically connected to the thermoelectric cooler 16 such that the amount of cooling provided by the heat pump can be adjusted based upon the temperature of the submount. Preferably, the temperature sensor and the thermoelectric cooler are designed such that the heat pump maintains the submount at a relatively constant temperature.

Figure 4:
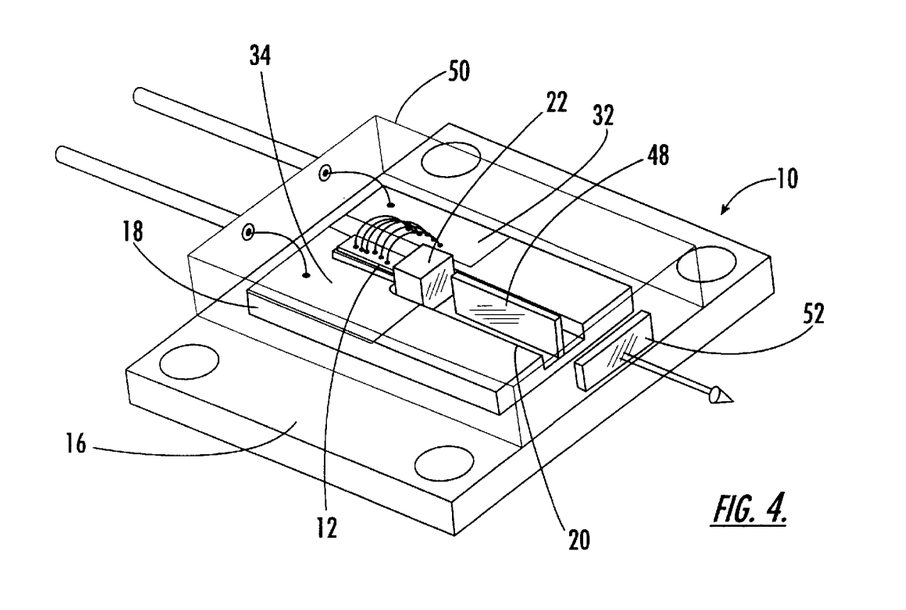
FIG. 4 is perspective view of the submount assembly according to yet another embodiment of the present invention.

FIG. 4 illustrates another embodiment of a submount assembly 10 according to the present invention. As shown, the submount 18 of this embodiment defines a slot 20 in which a microresonator cavity 22 and an electro-optically tuned waveguide or one or more non-linear optic crystals 48 are disposed. As described above, the submount assembly of this embodiment also includes a laser diode 12 mounted in alignment with the microresonator cavity such that the output of the laser diode pumps the microresonator cavity and, more particularly, the active gain medium 14 of the microresonator cavity.

As illustrated in FIG. 4, the submount 18 can be mounted upon the passive heat sink 16, such as a silver base that is plated with an alloy of gold and nickel. In contrast to the packaged design of FIG. 2, the submount can be disposed within a housing 50 having a plurality of conductive pins such that by establishing appropriate electrical connections between the conductive pins and the respective leads of the submount assembly, including the anode and the cathode, the laser diode can be appropriately driven. In one embodiment, the housing is formed of oxygen free, high conductivity copper that is sealably mounted to the underlying heat sink by means of thermal grease, indium foil or the like so as to minimize the thermal impedance of the seal between the housing and the heat sink. The housing also generally includes an anti-reflection coated window 52 aligned with the KTP waveguide through which the linearly polarized TEM$_{00}$ laser pulses are emitted.

Figure 5:
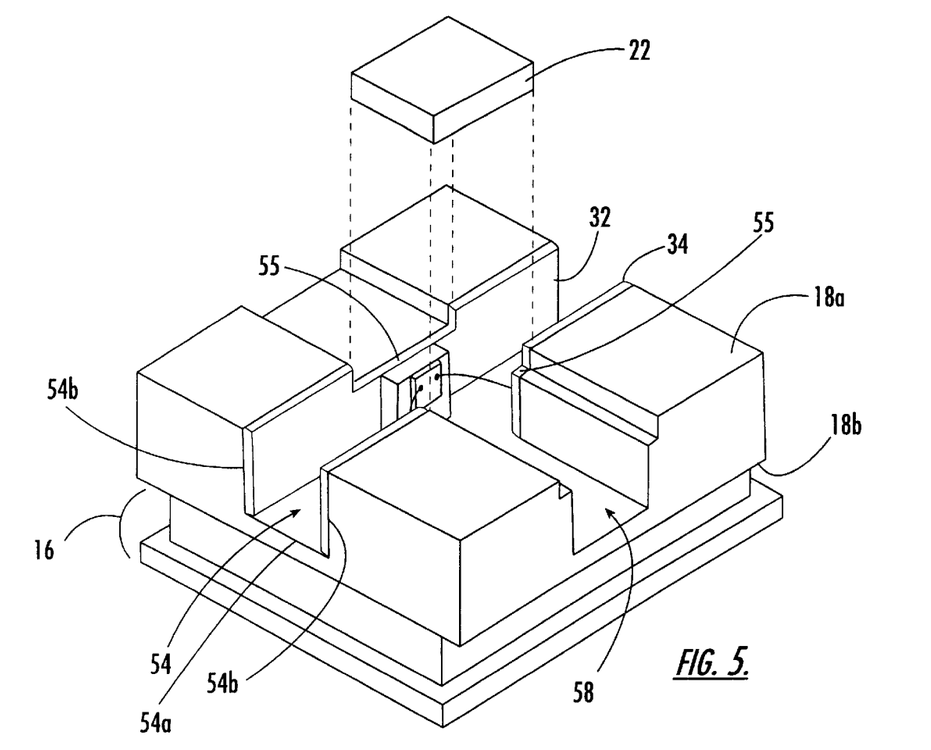
FIG. 5 is an exploded perspective view of the submount assembly according to another advantageous embodiment.
Figure 6:
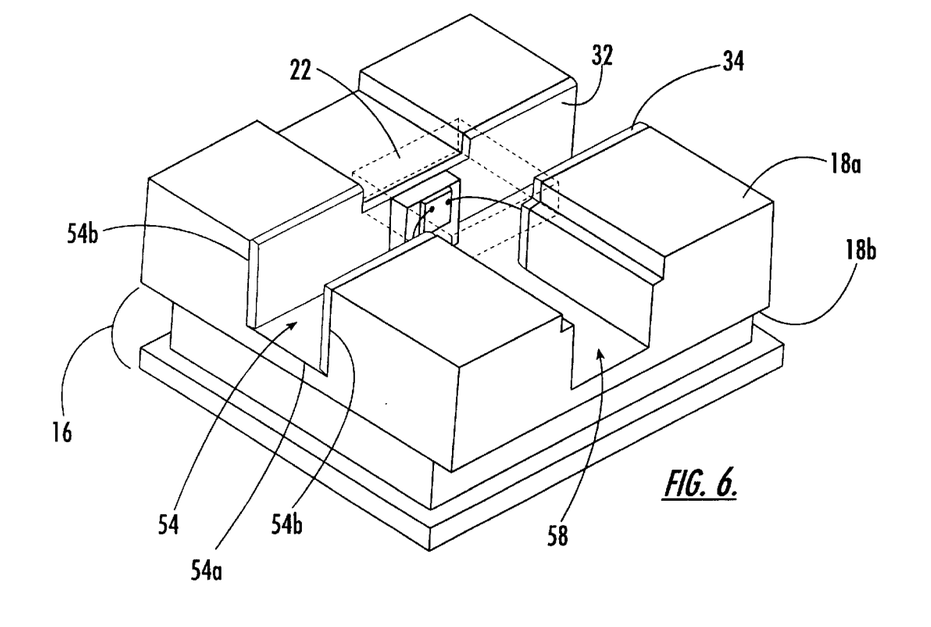
FIG. 6 is an assembled perspective view of the advantageous submount assembly of FIG. 5.

Yet another embodiment of a submount assembly 10 according to the present invention is illustrated in FIGS. 5 and 6. As shown, the submount assembly of this advantageous embodiment includes a submount 18 having a first surface 18a which defines a first groove 54. The first groove opens through the first surface and has a bottom 54a and a pair of opposed sidewalls 54b. The submount assembly also includes a laser diode 12 mounted upon one sidewall of the first groove. In this regard, the laser diode is generally mounted upon a thermal spreader 25 which, in turn, is mounted to a sidewall of the first groove. The laser diode is oriented such that the output of the laser diode is directed toward the opening of the first groove through the first surface of the submount. In the embodiment of the submount assembly illustrated in FIG. 6, the output of the laser diode is directed in an upward direction.

The submount assembly 10 of this embodiment also includes an active gain medium 14 and, more typically, a microresonator cavity 22 including an active gain medium and an associated saturable absorber 24. The microresonator cavity is supported by the first surface 18a of the submount 18 so as to overlie at least that portion of the first groove 54 within which the laser diode 12 is disposed. As such, the output of the laser diode will pump the active gain medium so as to produce a series of laser output pulses. Although the active gain medium can be supported by the first surface of the submount in a variety of fashions, the first surface of the submount of one advantageous embodiment defines the plurality of ledges 55 opening into the first groove. In this embodiment, edge portions of the microresonator cavity can be supported by the plurality of ledges so as to bridge the first groove and overlie the laser diode. Preferably, the first surface of the submount defines ledges adjacent each of the opposed sidewalls 54b of the first groove for supporting the four corners of the microresonator cavity as illustrated in FIGS. 5 and 6.

The submount assembly 10 of this embodiment is preferably formed such that the laser diode 12 is appropriately spaced from the microresonator cavity 22. Although different spacings can be employed, the laser diode is generally spaced from the microresonator cavity by 20±5 microns. In order to provide the desired spacing, the laser diode is preferably mounted upon the thermal spreader 25 proximate one end thereof. By appropriately sizing the thermal spreader relative to the depth of the first groove 54, the laser diode can be appropriately spaced from the microresonator cavity by mounting the thermal spreader to the sidewall of the first groove such that the end of the thermal spreader opposite the laser diode contacts the bottom 54a of the first groove.

As shown in FIGS. 5 and 6, the first surface 18a of the submount 18 also preferably defines a second groove 58 extending between one edge of the submount and the first groove 54. The second groove preferably opens into the first groove at a position generally aligned with the laser diode 12 such that the laser diode is exposed via the second groove. As illustrated by FIGS. 5 and 6, the first and second grooves are preferably orthogonal. As such, the second groove facilitates the mounting of the laser diode upon the sidewall 54b of the first groove by permitting access to the sidewall of the first groove in a direction generally perpendicular to the sidewall. Although not necessary for the practice of the present invention, the cross-sectional shapes and dimensions of the first and second grooves are generally the same.

As further illustrated in FIGS. 5 and 6, the submount assembly 10 of this advantageous embodiment also generally includes first and second metallization layers 32,34 disposed upon different portions of the submount 18. Although the first and second metallization layers can be disposed within respective recesses 20 defined by the first surface 18a of the submount as described above in conjunction with the embodiment of FIG. 1, the first and second metallization layers of the illustrated embodiment are disposed upon opposite sidewalls 54b of the first groove 54. By metallizing the thermal spreader 25 upon which the laser diode 12 is mounted, electrical contact is established between the laser diode and the metallization layer coating the sidewall upon which the laser diode is mounted. As shown, wire bonds or ball bonds can be established between the laser diode and the metallization layer coating the other sidewall of the first groove. By applying appropriate voltage and current to the metallization layers, the laser diode can be driven so as to produce an output which pumps the microresonator cavity 22 overlying the laser diode.

As described above in conjunction with other embodiments of the submount assembly 10, the submount 18 can be mounted upon a heat sink 16, such as a Peltier heat pump or other thermoelectric cooler. In this regard, the submount is also preferably formed of a thermally conductive, electrically insulating material, such as beryllium oxide, aluminum oxide or aluminum nitride. As such, the submount will provide a path of low thermal impedance from the electro-optic components to the heat sink, while effectively electrically isolating the various electro-optic components as well as the first and second metallization layers.

The submount assembly 10 of this advantageous embodiment can also be mounted within an appropriate electro-optic package 36, such as a TO-3 or TO-8 package, as shown in FIG. 2 and as described below. In this regard, the submount assembly of this advantageous embodiment can be packaged as described below in conjunction with FIGS. 10A–10C so as to further protect the various electro-optic components mounted upon the submount 18.

Figure 7:
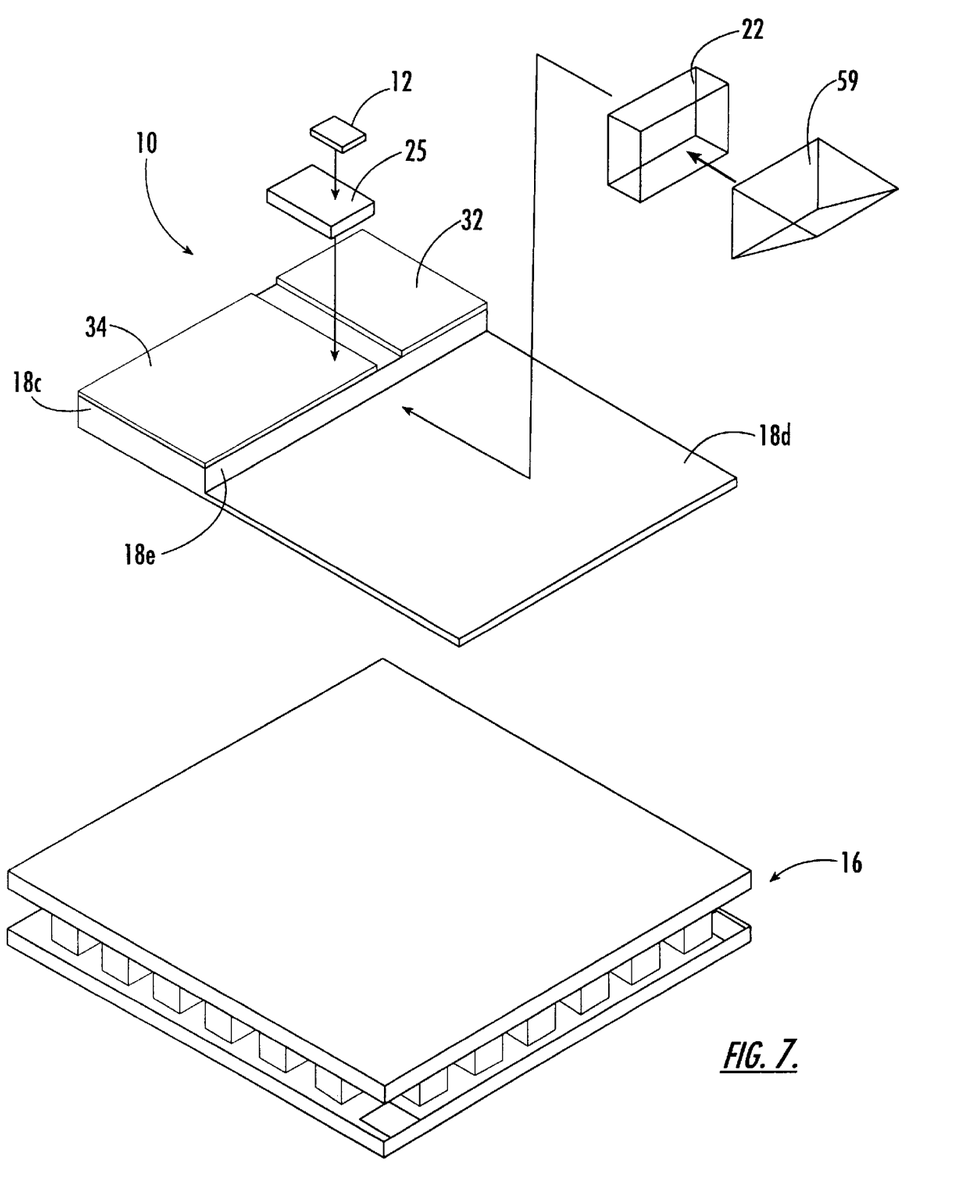
FIG. 7 is an exploded perspective view of a submount assembly according to another embodiment of the present invention.
Figure 8:
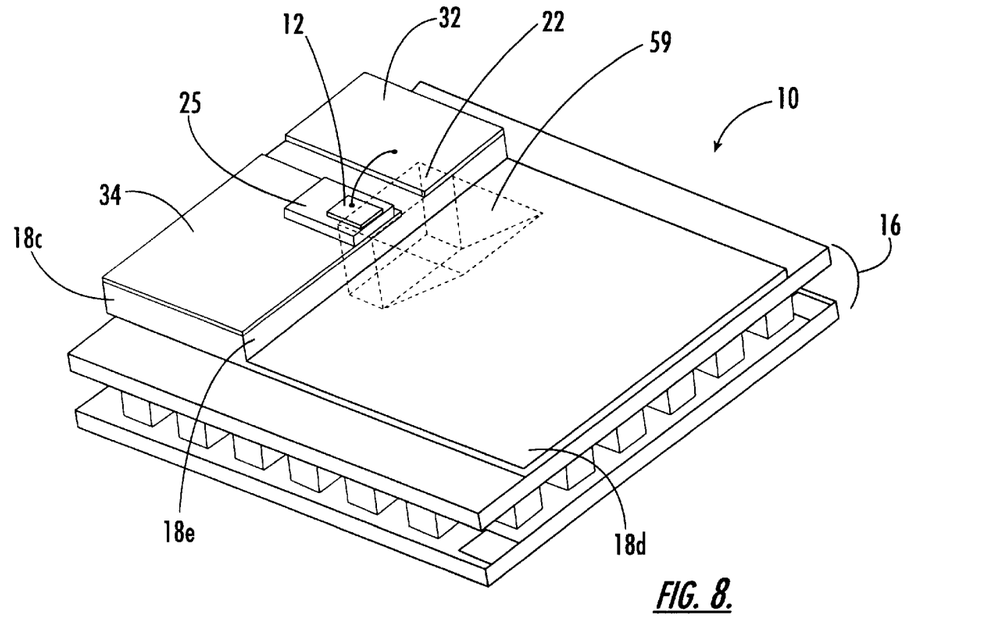
FIG. 8 is an assembled perspective view of the submount assembly of FIG. 7.

Although the submount assemblies 10 illustrated in FIGS. 1–6 and described hereinabove include a submount 18 having a first surface 13a which defines one or more recesses 20 for receiving and aligning respective electro-optic components, the submount assembly and, more particularly, the submount can define various other types of registration features for aligning respective components without departing from the spirit and scope of the present invention. As shown in FIGS. 7 and 8, the submount assembles of another embodiment includes a submount having a first surface which includes an upper shelf 18c and a lower shelf 18d. According to this embodiment, the registration feature defined by the submount is an upstanding wall 18e extending between the upper and lower shelves. As illustrated, electro-optic components can be precisely positioned with respect to the upstanding wall such that the components are aligned.

For example, the microresonator cavity 22 and a right angle prism 59 can be mounted upon the lower shelf 18d adjacent the upstanding wall 18e while a laser diode 12 can be mounted upon the upper shelf 18c in alignment with the microresonator cavity such that the output of the laser diode pumps the active gain medium 14 of the microresonator cavity. Typically, the laser diode is spaced, such as by 20±5 microns, from the registration feature 20, i.e., the upstanding wall, in order to provide the proper spacing between the emitting facet of the laser diode and the microresonator cavity. As shown in FIGS. 7 and 8, first and second metallization layers 32,34 are also disposed upon different portions of the submount 18. Although not illustrated, the upper shelf of the submount can define respective recesses within which the first and second metallization layers are disposed, if so desired. Since the submount is not only thermally conductive but is also electrically insulating, the submount assembly 10 can effectively electrically isolate the various electro-optic components and the first and second metallization layers.

The submount assembly 10 of FIGS. 7 and 8 also includes a heat sink 16, such as a thermoelectric cooler. As illustrated in FIGS. 7 and 8, conventional thermoelectric coolers include one or more couples, typically formed of bismuth telluride, sandwiched between a pair of thermally conductive plates, such as aluminum oxide plates. As shown in FIGS. 1–6 in conjunction with other embodiments of the submount assembly, however, the submount 18 can also serve as the upper plate of the thermoelectric cooler such that the submount and the heat sink 16 are an integral assembly. Although not shown, the submount assemblies of FIGS. 1–6 can include other types of heat sinks, including more conventional thermoelectric coolers, if so desired. Likewise, the submount assembly of FIGS. 7 and 8 can be integrated with a thermoelectric cooler as shown in FIGS. 1–6, if so desired.

Figure 9:
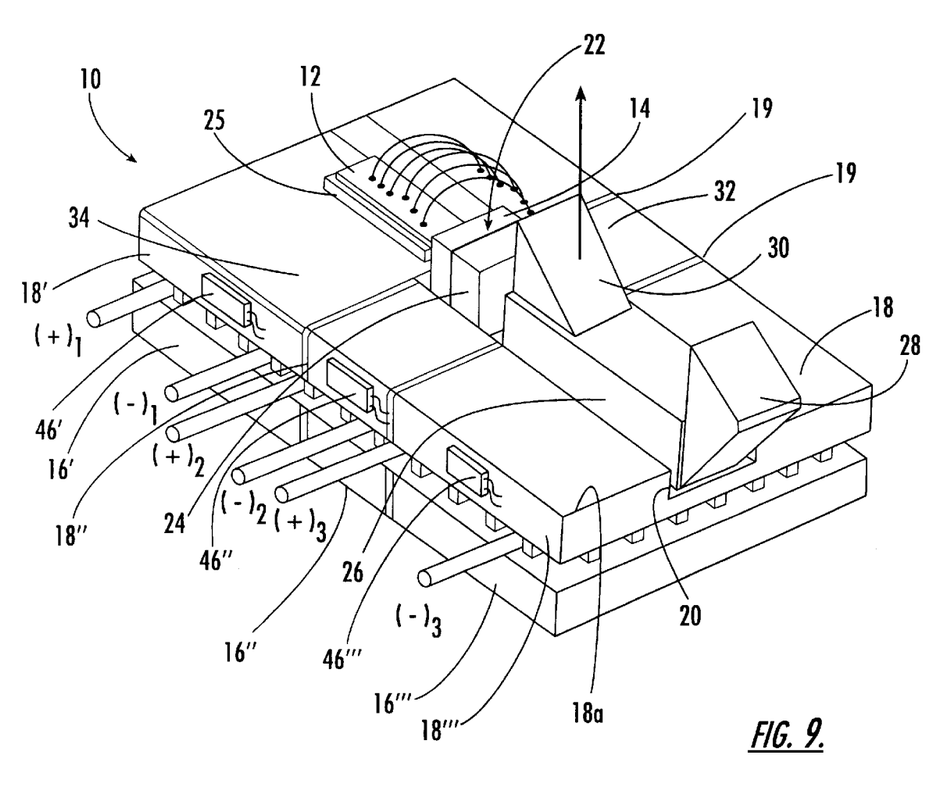
FIG. 9 is a perspective view of a submount assembly according to another embodiment of the present invention which includes a segmented submount.

Although the submount assemblies 10 illustrated in FIGS. 1–8 include a single heat sink 16 or, more precisely, a single Peltier heat pump, the submount assembly can be segmented and can correspondingly have a plurality of heat sinks, one of which is associated with each segment of the submount assembly. As shown in FIG. 9, the submount 18 of this embodiment can be divided into a plurality of segments separated by relatively thin air gaps 19. In particular, the submount can include a first segment 18' which supports the laser diode 12, a second segment 18" which supports the microresonator cavity 22, and a third segment 18'" which supports the components downstream of the microresonator cavity including the frequency doubling crystal 26. Correspondingly, the submount assembly can include three heat sinks and, more preferably, three Peltier heat pumps, one of which is associated with each segment of the submount.

As also illustrated in FIG. 9, the submount assembly 10 can include a plurality of temperature sensors 46, one of which is associated with and monitors the temperature of each respective segment of the submount 18. Although not illustrated, a controller can receive signals from the temperature sensors that are representative of the temperature of each of the various segments of the submount. The controller can then apply appropriate voltages to the leads of the Peltier heat pumps in order to individually control the temperature of each segment of the submount.

For example, since the laser diode 12 generally generates more heat than the other components, the heat pump 16' associated with the first submount segment 18' upon which the laser diode is mounted can cool the first submount segment more than the second and third submount segments. In order to maintain the wavelength of the signals emitted by the laser diode within the central portion of the pump band of the active gain medium 14, the first submount segment is preferably cooled such that the temperature of the laser diode remains relatively constant since the wavelength of the signals emitted by the laser will otherwise vary if the temperature of the laser diode fluctuates. Additionally, the heat pumps associated with the second and third submount segments can cool or heat the respective submount segments such that the microresonator cavity 22 and the other components, such as the frequency doubling crystal 26, are maintained at a temperature that enhances their operating efficiency.

Figure 10A:
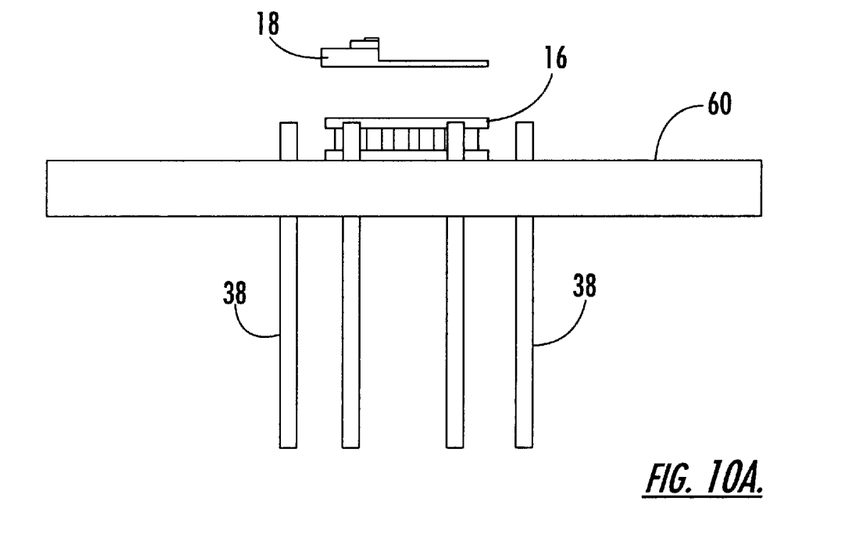
FIG. 10A is a side view illustrating the mounting of a heat sink and, in turn, a submount upon the support surface of an electro-optic package.

The present invention also provides an advantageous method for packaging the electro-optic system which will now be described in conjunction with the embodiment of the submount assembly 10 illustrated in FIGS. 7 and 8. According to this aspect of the present invention, the submount assembly, including the submount 18, is initially mounted upon a support surface of a package 36, such as a TO-3 or TO-8 package. As shown in FIG. 10A, the heat sink 16, such as a Peltier heat pump, can be initially mounted upon the support surface of the package and the submount can thereafter be mounted upon the heat sink.

Although the laser diode 12 and the metallization layers 32,34 are generally disposed upon the submount prior to its mounting to the heat sink, one or more of the electro-optic components, including the microresonator cavity 22, are not mounted upon the submount at the time of its mounting to the heat sink. Although the submount assembly can be mounted in a variety of fashions, the heat sink is typically adhered to the support surface of the package and the second surface 18b of the submount is typically adhered to the heat sink by means of a thermally matched epoxy, such as aluminum oxide filled or silver filled epoxies.

Figure 10B:
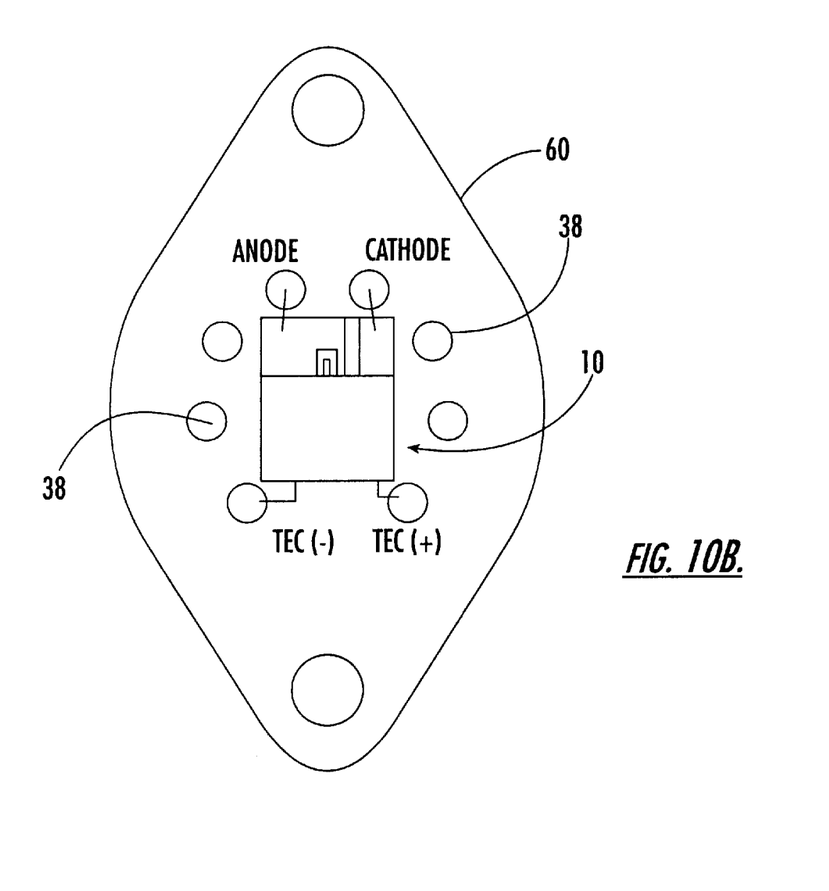
FIG. 10B is a top view of the electro-optic package including a portion of the submount assembly which illustrates the establishment of appropriate electrical connections between the conductive pins of the package and respective leads of the submount assembly.

The package 36 includes a plurality of conductive pins 38 which extend through the base 60 of the package and which surround the support surface of the package. Once the heat sink 16 and the submount 18 have been mounted, electrical connections are then established between the conductive pins of the package and respective leads of the submount assembly 10, as illustrated in FIG. 10B. For example, electrical connections are established between the conductive pins of the package and the anode, the cathode and respective leads of the thermoelectric cooler.

Figure 10C:
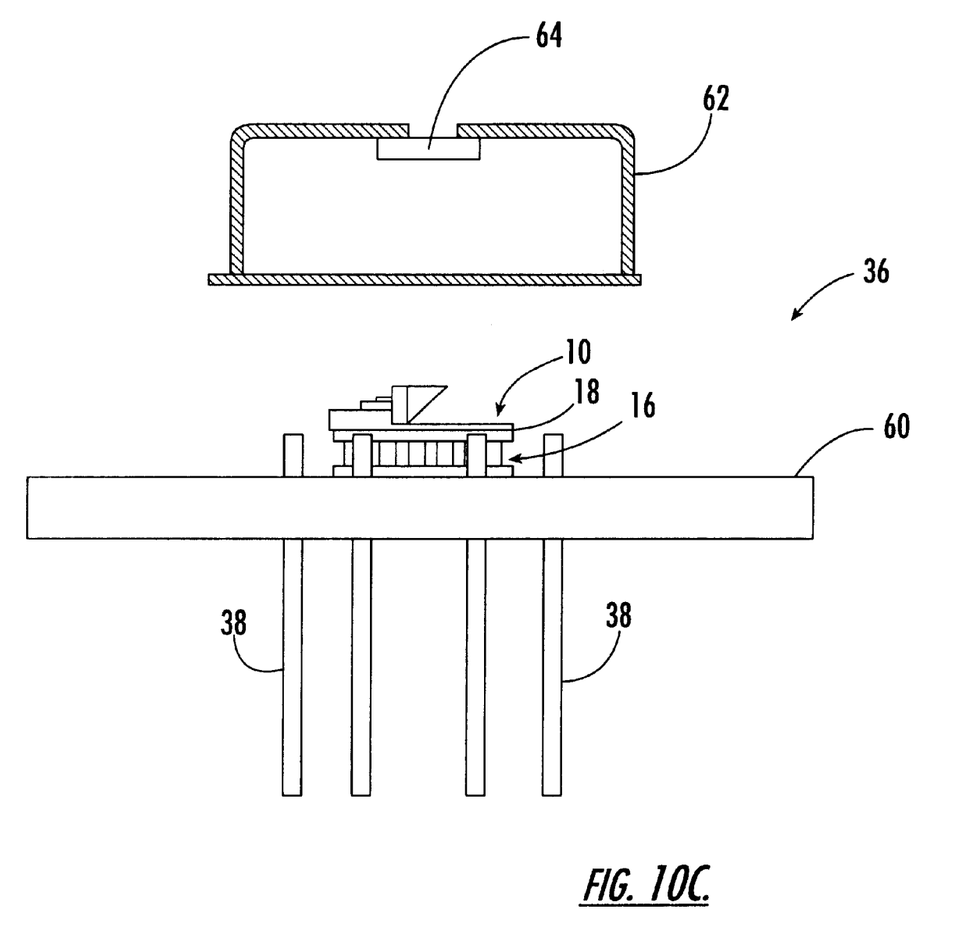
FIG. 10C is a side view of the resulting package following the mounting of the electro-optic components upon the submount.

Once the submount assembly 10 has been mounted upon the support surface of the package 36 and appropriate electrical connections have been established, the remainder of the electro-optic components, including the microresonator cavity 22, can be mounted upon the submount 18 in alignment with the registration features 20, such as the recesses, defined by the first surface 18a of the submount. In this embodiment, for example, the microresonator cavity and the right angle prism 59 are preferably mounted upon the submount as described above in conjunction with FIGS. 7 and 8. Although the components can be mounted in a variety of fashions, the electro-optic components of one embodiment are preferably mounted upon the submount by means of a pick and place machine utilizing vacuum pick-up in order to increase the efficiency of the fabrication process. As shown in FIG. 10C, the lid 62 is mounted to the base of the package 36 so as to enclose the submount assembly. As shown in FIG. 2, the lid includes a window 64, however, such that by applying appropriate voltages to the conductive pins 38, the electro-optic system supported by the submount can emit laser pulses through the window.

By mounting at least some of the components including the microresonator cavity 22 upon the submount 18 after the submount assembly 10 has already been mounted upon the support surface of the package 36, the method of the present invention provides a number of advantages. In particular, the fabrication method of the present invention reduces the handling of the various components, thereby reducing the exposure of the components to static electricity and other deleterious conditions. In addition, the packaging technique of the present invention limits heating of a number of electro-optic components, including the microresonator cavity, that could deleteriously affect the operation and/or lifetime of the other electro-optic components.

As described above, the submount assembly 10 of the present invention includes a submount 18 for precisely aligning the various components of an electro-optic system, including a laser diode 12 and an associated microresonator cavity 22. In addition, the submount is not only thermally conductive, but is also electrically insulating in order to effectively electrically isolate the various electro-optic components mounted thereupon. Further, the packaging method of the present invention reduces handling and heating of the submount assembly following the mounting of the electro-optic components upon the submount, thereby reducing exposure of the various components to heat, static electricity and other deleterious conditions.

In the drawings and the specification, there has been set forth a preferred embodiment of the invention and, although specific terms are employed, the terms are used in a generic and descriptive sense only and not for purpose of limitation, the scope of the invention being set forth in the following claims.

That which is claimed is:

1. A submount assembly comprising:
    a heat sink;
    a submount, mounted upon said heat sink, having opposed first and second surfaces, said submount comprised of a thermally conductive, electrically insulating material, wherein the first surface of said submount defines at least one registration feature for aligning a respective component; and
    first and second metallization layers disposed upon different portions of said submount to thereby form a cathode and an anode, respectively, wherein at least one of said first and second metallization layers is disposed directly upon the first surface of said submount.

2. A submount assembly according to claim 1 wherein said submount defines at least one recess for receiving a respective component.

3. A submount assembly according to claim 2 further comprising:
    an active gain medium disposed within a respective recess; and
    a laser diode mounted upon the first surface of said submount in alignment with said active gain medium such that an output of said laser diode pumps said active gain medium.

4. A submount assembly comprising:
    a heat sink;
    a submount, mounted upon said heat sink, having opposed first and second surfaces, said submount comprised of a thermally conductive, electrically insulating material, wherein the first surface of said submount defines at least one registration feature for aligning a respective component, and wherein said submount defines at least one recess for receiving a respective component; and
    first and second metallization layers disposed upon different portions of said submount to thereby form a cathode and an anode, respectively, wherein said first and second metallization layers are disposed within respective recesses defined by the first surface of said submount.

5. A submount assembly comprising:
    a heat sink;
    a submount, mounted upon said heat sink, having opposed first and second surfaces, said submount comprised of a thermally conductive, electrically insulating material, wherein the first surface of said submount defines at least one registration feature for aligning a respective component, wherein the first surface of said submount includes an upper shelf and a lower shelf, and wherein the registration feature comprises an upstanding wall extending between the upper and lower shelves; and first and second metallization layers disposed upon different portions of said submount to thereby form a cathode and an anode, respectively.

6. A submount assembly according to claim 5 further comprising:

an active gain medium disposed upon the lower shelf adjacent the upstanding wall; and a laser diode mounted upon the upper shelf in alignment with said active gain medium such that an output of said laser diode pumps said active gain medium.

7. A submount assembly comprising:

a heat sink;

a submount, mounted upon said heat sink, having opposed first and second surfaces, said submount comprised of a thermally conductive, electrically insulating material, wherein the first surface of said submount defines at least one registration feature for aligning a respective component, and wherein the submount is formed of a material selected from the group consisting of beryllium oxide, aluminum oxide and aluminum nitride; and first and second metallization layers disposed upon different portions of said submount to thereby form a cathode and an anode, respectively.

8. A submount assembly comprising:

a heat sink;

a submount, mounted upon said heat sink, having opposed first and second surfaces, said submount comprised of a thermally conductive, electrically insulating material, wherein the first surface of said submount defines at least one registration feature for aligning a respective component; and first and second metallization layers disposed upon different portions of said submount to thereby form a cathode and an anode, respectively, wherein said submount comprises a plurality of submount segments, and wherein said heat sink comprises a plurality of heat sinks associated with respective ones of said submount segments.

9. A submount assembly comprising:

a submount having opposed first and second surfaces, wherein the first surface of said submount defines a first groove opening through the first surface and having a pair of opposed sidewalls;

a laser diode mounted upon a sidewall of the first groove defined by the first surface of said submount such that an output of said laser diode is directed toward the opening of the first groove through the first surface of said submount; and an active gain medium supported by the first surface of said submount so as to overlie at least that portion of the first groove within which said laser diode is disposed such that the output of said laser diode pumps said active gain medium.

10. A submount assembly according to claim 9 wherein the first surface of said submount defines a plurality of ledges opening into the first groove, and wherein edge portions of said active gain medium are supported by the plurality of ledges such that said active gain medium bridges the first groove and overlies said laser diode.

11. A submount assembly according to claim 9 wherein the first surface of said submount defines a second groove extending between one edge of said submount and the first groove such that said laser diode is exposed via the second groove.

12. A submount assembly according to claim 11 wherein the first and second grooves are orthogonal.

13. A submount assembly according to claim 9 further comprising first and second metallization layers disposed upon different portions of said submount to thereby form a cathode and an anode, respectively, for providing electrical energy to said laser diode.

14. A submount assembly according to claim 9 further comprising a thermal spreader upon which said laser diode is mounted, wherein said thermal spreader is mounted upon the sidewall of the first groove defined by the first surface of said submount, and wherein said thermal spreader is positioned so as to contact a bottom surface of the first groove in order to establish proper spacing between said laser diode and said active gain medium.

15. A submount assembly according to claim 9 further comprising a heat sink upon which said submount is mounted, and wherein said submount is comprised of a thermally conductive, electrically insulating material.

16. A method of packaging an electro-optic system comprising the steps of:

defining at least one registration feature on a first surface of a submount;

mounting a submount assembly including the submount upon a support surface of a package, wherein the package includes a plurality of conductive pins surrounding the support surface;

establishing electrical connections between the conductive pins of the package and respective leads of the submount assembly; and mounting a component upon the submount in alignment with the registration feature define on the first surface of the submount following said steps of mounting the submount assembly in the package and establishing electrical connections therewith.

17. A method according to claim 16 wherein said defining step comprises defining at least one recess within the first surface of the submount for receiving a respective component.

18. A method according to claim 17 wherein said mounting step comprises the step of disposing an active gain medium within a respective recess and in alignment with a laser diode that is mounted upon the first surface of the submount such that an output of the laser diode pumps the active gain medium.

19. A method according to claim 17 further comprising the step of forming first and second metallization layers within respective recesses defined by the first surface of the submount prior to mounting the submount assembly upon the support surface of the package.

20. A method according to claim 16 wherein said defining step comprises providing a submount having a first surface which includes an upper shelf and a lower shelf separated by an upstanding wall which serves as the registration feature.

21. A method according to claim 19 wherein the mounting step comprises the step of disposing an active gain medium upon the lower shelf adjacent the upstanding wall and in alignment with a laser diode that is mounted upon the upper shelf such that an output of the laser diode pumps the active gain medium.

* * * * *